(12) United States Patent
Light et al.

(10) Patent No.: US 8,641,428 B2
(45) Date of Patent: Feb. 4, 2014

(54) ELECTRICAL CONNECTOR AND METHOD OF MAKING IT

(75) Inventors: David Noel Light, Los Gatos, CA (US); Dinesh Sundararajan Kalakkad, Palo Alto, CA (US); Peter Tho Nguyen, San Jose, CA (US)

(73) Assignee: Neoconix, Inc., Sunnyvale, CA (US)

( * ) Notice: Subject to any disclaimer, the term of this patent is extended or adjusted under 35 U.S.C. 154(b) by 0 days.

(21) Appl. No.: 13/310,647

(22) Filed: Dec. 2, 2011

(65) Prior Publication Data

US 2013/0143420 A1    Jun. 6, 2013

(51) Int. Cl.
*H01R 12/00* (2006.01)

(52) U.S. Cl.
USPC .......................................................... 439/66

(58) Field of Classification Search
USPC .......................................................... 439/66
See application file for complete search history.

(56) References Cited

U.S. PATENT DOCUMENTS

| | | | |
|---|---|---|---|
| 1,668,011 A | 5/1928 | Friedmann |
| 2,382,771 A | 8/1945 | Bowers |
| 3,212,049 A | 10/1965 | Mittler et al. |
| 3,543,587 A | 12/1970 | Kawada |
| 3,634,807 A | 1/1972 | Grobe et al. |
| 3,670,409 A | 6/1972 | Reimer |
| 3,850,500 A | 11/1974 | Cobaugh et al. |
| 4,087,146 A | 5/1978 | Hudson, Jr. |
| 4,175,810 A | 11/1979 | Holt et al. |
| 4,257,417 A | 3/1981 | Gibilisco |
| 4,344,430 A | 8/1982 | Astrove |
| 4,548,451 A | 10/1985 | Benarr et al. |
| 4,592,617 A | 6/1986 | Seidler |
| 4,657,336 A | 4/1987 | Johnson et al. |
| 4,734,053 A | 3/1988 | Imai |
| 4,790,777 A | 12/1988 | Iimori et al. |
| 4,893,172 A | 1/1990 | Matsumoto et al. |
| 4,944,690 A | 7/1990 | Imai |

(Continued)

FOREIGN PATENT DOCUMENTS

| | | |
|---|---|---|
| EP | 692823 A1 | 1/1996 |
| EP | 1005086 A2 | 5/2000 |

(Continued)

OTHER PUBLICATIONS

Guerin, et al., "Spring Land Grid Array Development: an Integrated Demountable Solution", www.chips.ibm.com/news, MicroNews Third Quarter 2001, pp. 22-24.

(Continued)

*Primary Examiner* — Ross Gushi
(74) *Attorney, Agent, or Firm* — Kenneth A. Seaman

(57) ABSTRACT

The present invention is an electrical connector in which a substrate (such as a printed circuit board or PCB) includes a plurality of apertures (or vias) and some of those apertures are filled with two materials to improve the characteristics of the electrical interconnection. The preferred process of crating the filled vias includes the steps of plating the vias with an electrically-conductive material to create an electrically-conductive path between portions of the substrate and components associated with the substrate and partially filling the apertures, then filling at least a portion of the apertures or vias with a second or different filling material to seal at least apart of the electrically conductive path through the plating. The second filling material may be chosen to provide thermal compensation for the connection.

23 Claims, 6 Drawing Sheets

(56) References Cited

U.S. PATENT DOCUMENTS

| | | |
|---|---|---|
| 4,960,407 A | 10/1990 | Cope |
| 4,998,885 A | 3/1991 | Beaman |
| 5,010,641 A | 4/1991 | Sisler |
| 5,053,083 A | 10/1991 | Sinton |
| 5,135,403 A | 8/1992 | Rinaldi |
| 5,139,427 A | 8/1992 | Boyd et al. |
| 5,148,266 A | 9/1992 | Khandros et al. |
| 5,152,695 A | 10/1992 | Grabbe et al. |
| 5,161,983 A | 11/1992 | Ohno et al. |
| 5,173,055 A | 12/1992 | Grabbe |
| 5,199,879 A | 4/1993 | Kohn et al. |
| 5,228,861 A | 7/1993 | Grabbe |
| 5,257,950 A | 11/1993 | Lenker et al. |
| 5,292,558 A | 3/1994 | Heller et al. |
| 5,299,939 A | 4/1994 | Walker et al. |
| 5,316,496 A | 5/1994 | Imai |
| 5,338,209 A | 8/1994 | Brooks et al. |
| 5,358,411 A | 10/1994 | Mroczkowski et al. |
| 5,366,380 A | 11/1994 | Reymond |
| 5,373,964 A | 12/1994 | Moore |
| 5,380,210 A | 1/1995 | Grabbe et al. |
| 5,409,200 A | 4/1995 | Zingher et al. |
| 5,423,687 A | 6/1995 | Laub |
| 5,468,655 A | 11/1995 | Greer |
| 5,483,741 A | 1/1996 | Akram et al. |
| 5,509,814 A | 4/1996 | Mosquera |
| 5,528,456 A | 6/1996 | Takahashi |
| 5,529,504 A | 6/1996 | Greenstein et al. |
| 5,530,288 A | 6/1996 | Stone |
| 5,532,612 A | 7/1996 | Liang |
| 5,562,487 A | 10/1996 | Ii et al. |
| 5,575,662 A | 11/1996 | Yamamoto et al. |
| 5,583,378 A | 12/1996 | Marrs et al. |
| 5,590,460 A | 1/1997 | DiStefano et al. |
| 5,593,903 A | 1/1997 | Beckenbaugh et al. |
| 5,629,837 A | 5/1997 | Barabi et al. |
| 5,632,631 A | 5/1997 | Fjelstad et al. |
| 5,634,821 A | 6/1997 | Crane |
| 5,654,231 A | 8/1997 | Liang et al. |
| 5,691,913 A | 11/1997 | Tsuchida et al. |
| 5,751,556 A | 5/1998 | Butler et al. |
| 5,759,047 A | 6/1998 | Brodsky et al. |
| 5,772,451 A | 6/1998 | Dozier, II et al. |
| 5,791,911 A | 8/1998 | Fasano et al. |
| 5,802,699 A | 9/1998 | Fjelstad et al. |
| 5,812,378 A | 9/1998 | Fjelstad et al. |
| 5,842,273 A | 12/1998 | Schar |
| 5,860,585 A | 1/1999 | Rutledge et al. |
| 5,896,038 A | 4/1999 | Budnaitis et al. |
| 5,903,059 A | 5/1999 | Bertin et al. |
| 5,906,498 A | 5/1999 | Nagafuji |
| 5,911,597 A | 6/1999 | Oshitani |
| 5,934,914 A | 8/1999 | Fjelstad et al. |
| 5,938,453 A | 8/1999 | Ichimura |
| 5,956,575 A | 9/1999 | Bertin et al. |
| 5,967,797 A | 10/1999 | Maldonado |
| 5,967,850 A | 10/1999 | Crane |
| 5,980,335 A | 11/1999 | Barbieri et al. |
| 5,981,870 A | 11/1999 | Barcley et al. |
| 5,984,704 A | 11/1999 | Hashiguchi |
| 5,989,994 A | 11/1999 | Khoury et al. |
| 5,993,247 A | 11/1999 | Kidd |
| 6,000,280 A | 12/1999 | Miller et al. |
| 6,019,611 A | 2/2000 | McHugh et al. |
| 6,027,366 A | 2/2000 | Mori et al. |
| 6,029,344 A | 2/2000 | Khandros et al. |
| 6,031,282 A | 2/2000 | Jones et al. |
| 6,032,356 A | 3/2000 | Eldridge et al. |
| 6,042,387 A | 3/2000 | Jonaidi |
| 6,044,548 A | 4/2000 | Distefano et al. |
| 6,056,572 A | 5/2000 | Matsumoto et al. |
| 6,063,640 A | 5/2000 | Mizukoshi et al. |
| 6,072,323 A | 6/2000 | Hembree et al. |
| 6,083,837 A | 7/2000 | Millet |
| 6,084,312 A | 7/2000 | Lee |
| 6,089,904 A | 7/2000 | Wu |
| 6,133,534 A | 10/2000 | Fukutomi et al. |
| 6,142,789 A | 11/2000 | Nolan et al. |
| 6,146,151 A | 11/2000 | Li |
| 6,152,771 A | 11/2000 | Juntwait |
| 6,156,484 A | 12/2000 | Bassous et al. |
| 6,170,808 B1 | 1/2001 | Kutschi |
| 6,181,144 B1 | 1/2001 | Hembree et al. |
| 6,184,699 B1 | 2/2001 | Smith et al. |
| 6,191,368 B1 | 2/2001 | Di Stefano et al. |
| 6,196,852 B1 | 3/2001 | Neumann et al. |
| 6,200,143 B1 | 3/2001 | Haba et al. |
| 6,203,347 B1 | 3/2001 | Crane |
| 6,204,065 B1 | 3/2001 | Ochiai |
| 6,205,660 B1 | 3/2001 | Fjelstad et al. |
| 6,208,157 B1 | 3/2001 | Akram et al. |
| 6,218,848 B1 | 4/2001 | Hembree et al. |
| 6,220,869 B1 | 4/2001 | Grant et al. |
| 6,221,750 B1 | 4/2001 | Fjelstad |
| 6,224,392 B1 | 5/2001 | Fasano et al. |
| 6,250,933 B1 | 6/2001 | Khoury et al. |
| 6,255,727 B1 | 7/2001 | Khoury |
| 6,255,736 B1 | 7/2001 | Kaneko |
| 6,263,566 B1 | 7/2001 | Hembree et al. |
| 6,264,477 B1 | 7/2001 | Smith et al. |
| 6,293,806 B1 | 9/2001 | Yu |
| 6,293,808 B1 | 9/2001 | Ochiai |
| 6,297,164 B1 | 10/2001 | Khoury et al. |
| 6,298,552 B1 | 10/2001 | Li |
| 6,300,782 B1 | 10/2001 | Hembree et al. |
| 6,306,752 B1 | 10/2001 | DiStefano et al. |
| 6,315,616 B1 | 11/2001 | Hayashi |
| 6,329,604 B1 * | 12/2001 | Koya .......................... 174/255 |
| 6,332,801 B1 | 12/2001 | Watanbe |
| 6,335,210 B1 | 1/2002 | Farooq et al. |
| 6,336,269 B1 | 1/2002 | Eldridge et al. |
| 6,337,575 B1 | 1/2002 | Akram |
| 6,345,987 B1 | 2/2002 | Mori et al. |
| 6,352,436 B1 | 3/2002 | Howard |
| 6,361,328 B1 | 3/2002 | Gosselin |
| 6,373,267 B1 | 4/2002 | Hiroi |
| 6,374,487 B1 | 4/2002 | Haba et al. |
| 6,375,474 B1 | 4/2002 | Harper, Jr. et al. |
| 6,384,475 B1 | 5/2002 | Beroz et al. |
| 6,386,905 B1 | 5/2002 | Ito |
| 6,392,524 B1 | 5/2002 | Biegelsen et al. |
| 6,392,534 B1 | 5/2002 | Flick |
| 6,397,460 B1 | 6/2002 | Hembree |
| 6,399,900 B1 | 6/2002 | Khoury et al. |
| 6,402,526 B1 | 6/2002 | Schreiber et al. |
| 6,409,521 B1 | 6/2002 | Rathburn |
| 6,420,661 B1 | 7/2002 | Di Stefano et al. |
| 6,420,789 B1 | 7/2002 | Tay et al. |
| 6,420,884 B1 | 7/2002 | Khoury et al. |
| 6,428,328 B2 | 8/2002 | Haba et al. |
| 6,431,881 B1 | 8/2002 | Engbring et al. |
| 6,436,802 B1 | 8/2002 | Khoury |
| 6,437,591 B1 | 8/2002 | Farnworth et al. |
| 6,442,039 B1 | 8/2002 | Schreiber |
| D463,550 S | 9/2002 | Sherman |
| 6,447,305 B1 | 9/2002 | Roberts |
| 6,452,407 B2 | 9/2002 | Khoury et al. |
| 6,454,573 B2 | 9/2002 | Hayashi et al. |
| 6,461,892 B2 | 10/2002 | Beroz |
| 6,465,748 B2 | 10/2002 | Yamanashi et al. |
| 6,472,890 B2 | 10/2002 | Khoury et al. |
| 6,474,997 B1 | 11/2002 | Ochiai |
| 6,492,251 B1 | 12/2002 | Haba et al. |
| 6,497,581 B2 | 12/2002 | Slocum et al. |
| 6,517,362 B2 * | 2/2003 | Hirai et al. ...................... 439/82 |
| 6,520,778 B1 | 2/2003 | Eldridge et al. |
| 6,524,115 B2 | 2/2003 | Gates et al. |
| 6,532,654 B2 | 3/2003 | Guerin et al. |
| 6,551,112 B1 | 4/2003 | Li et al. |
| 6,558,187 B2 | 5/2003 | Aoki |
| 6,576,485 B2 | 6/2003 | Zhou et al. |
| 6,577,003 B1 | 6/2003 | Crane et al. |
| 6,580,031 B2 | 6/2003 | Chung |
| 6,604,950 B2 | 8/2003 | Maldonado et al. |

(56) References Cited

U.S. PATENT DOCUMENTS

| | | |
|---|---|---|
| 6,612,861 B2 | 9/2003 | Khoury et al. |
| 6,616,966 B2 | 9/2003 | Mathieu et al. |
| 6,622,380 B1 | 9/2003 | Grigg |
| 6,627,092 B2 | 9/2003 | Clements et al. |
| 6,640,432 B1 | 11/2003 | Mathieu et al. |
| 6,661,247 B2 | 12/2003 | Maruyama et al. |
| 6,663,399 B2 | 12/2003 | Ali et al. |
| 6,664,131 B2 | 12/2003 | Jackson |
| 6,669,489 B1 | 12/2003 | Dozier, II et al. |
| 6,671,947 B2 | 1/2004 | Bohr |
| 6,672,879 B2 | 1/2004 | Neidich et al. |
| 6,677,245 B2 | 1/2004 | Zhou et al. |
| 6,692,263 B2 | 2/2004 | Villain et al. |
| 6,692,265 B2 | 2/2004 | Kung et al. |
| 6,700,072 B2 | 3/2004 | Distefano et al. |
| 6,701,612 B2 | 3/2004 | Khandros et al. |
| 6,719,569 B2 | 4/2004 | Ochiai |
| 6,730,134 B2 | 5/2004 | Neidich |
| 6,733,326 B2 | 5/2004 | Lee |
| 6,736,664 B2 | 5/2004 | Ueda et al. |
| 6,736,665 B2 | 5/2004 | Zhou et al. |
| 6,749,459 B2 | 6/2004 | Urbaniak et al. |
| 6,750,136 B2 | 6/2004 | Zhou et al. |
| 6,750,551 B1 | 6/2004 | Frutschy et al. |
| 6,759,257 B2 | 7/2004 | McCormack et al. |
| 6,763,581 B2 | 7/2004 | Hirai et al. |
| 6,791,171 B2 | 9/2004 | Mok et al. |
| 6,814,584 B2 | 11/2004 | Zaderej |
| 6,814,587 B2 | 11/2004 | Ma |
| 6,815,961 B2 | 11/2004 | Mok et al. |
| 6,821,129 B2 | 11/2004 | Tsuchiya |
| 6,843,659 B2 | 1/2005 | Liao et al. |
| 6,847,101 B2 | 1/2005 | Fjelstad et al. |
| 6,848,173 B2 | 2/2005 | Fjelstad et al. |
| 6,848,929 B2 | 2/2005 | Ma |
| 6,853,210 B1 | 2/2005 | Farnworth et al. |
| 6,855,002 B2 | 2/2005 | Chiu |
| 6,857,880 B2 | 2/2005 | Ohtsuki et al. |
| 6,861,747 B2 | 3/2005 | Miyazaki et al. |
| 6,869,290 B2 | 3/2005 | Brown et al. |
| 6,869,307 B2 | 3/2005 | Endo |
| 6,881,070 B2 | 4/2005 | Chiang |
| 6,887,085 B2 | 5/2005 | Hirai |
| 6,898,580 B1 | 5/2005 | Curran et al. |
| 6,898,773 B1 | 5/2005 | Teig et al. |
| 6,902,425 B2 | 6/2005 | Huang |
| 6,916,181 B2 | 7/2005 | Brown et al. |
| 6,920,689 B2 | 7/2005 | Khandros et al. |
| 6,923,656 B2 | 8/2005 | Novotny et al. |
| 6,926,536 B2 | 8/2005 | Ochiai |
| 6,939,143 B2 | 9/2005 | Rathburn |
| 6,957,963 B2 | 10/2005 | Rathburn |
| 6,960,924 B2 | 11/2005 | Akram |
| 6,965,245 B2 | 11/2005 | Kister et al. |
| 6,976,888 B2 | 12/2005 | Shirai et al. |
| 6,980,017 B1 | 12/2005 | Farnworth et al. |
| 6,981,879 B2 * | 1/2006 | Kuczynski et al. .............. 439/66 |
| 6,995,557 B2 | 2/2006 | Goldfine et al. |
| 6,995,577 B2 | 2/2006 | Farnworth et al. |
| 7,001,208 B2 | 2/2006 | Huang |
| 7,002,362 B2 | 2/2006 | Farnworth et al. |
| 7,004,775 B1 | 2/2006 | Sakurai et al. |
| 7,009,413 B1 | 3/2006 | Alghouli |
| 7,021,941 B1 | 4/2006 | Chuang et al. |
| 7,021,970 B2 | 4/2006 | Ozai |
| 7,025,601 B2 | 4/2006 | Dittmann |
| D521,455 S | 5/2006 | Radza |
| D521,940 S | 5/2006 | Radza |
| 7,048,548 B2 | 5/2006 | Mathieu et al. |
| 7,053,482 B2 | 5/2006 | Cho |
| D522,461 S | 6/2006 | Radza |
| D522,972 S | 6/2006 | Long et al. |
| 7,056,131 B1 | 6/2006 | Williams |
| 7,063,560 B2 | 6/2006 | Asao |
| D524,756 S | 7/2006 | Radza |
| 7,070,419 B2 | 7/2006 | Brown et al. |
| 7,074,074 B2 | 7/2006 | Zhang et al. |
| 7,077,660 B2 * | 7/2006 | McAllister et al. .............. 439/66 |
| 7,083,425 B2 | 8/2006 | Chong et al. |
| 7,086,869 B1 | 8/2006 | Dangler et al. |
| 7,090,503 B2 | 8/2006 | Dittmann |
| 7,097,496 B2 | 8/2006 | Zhang et al. |
| 7,112,089 B1 | 9/2006 | Liu et al. |
| 7,113,408 B2 | 9/2006 | Brown et al. |
| 7,114,961 B2 | 10/2006 | Williams |
| 7,131,850 B2 * | 11/2006 | Frutschy .......................... 439/71 |
| 7,140,883 B2 | 11/2006 | Khandros et al. |
| 7,156,706 B2 | 1/2007 | Brown et al. |
| 7,189,090 B2 | 3/2007 | Aizawa et al. |
| 7,210,942 B2 | 5/2007 | Uchida et |
| 7,238,044 B2 | 7/2007 | Uchida et al. |
| 7,240,425 B2 | 7/2007 | Khilchenko et al. |
| 7,244,125 B2 | 7/2007 | Brown et al. |
| 7,244,195 B1 | 7/2007 | Yamagishi et al. |
| 7,245,137 B2 | 7/2007 | Eldridge et al. |
| 7,247,035 B2 * | 7/2007 | Mok et al. ........................ 439/81 |
| 7,252,540 B2 | 8/2007 | Tanaka |
| 7,261,569 B2 | 8/2007 | Uchida et al. |
| 7,261,595 B2 | 8/2007 | Shino |
| 7,263,771 B2 | 9/2007 | Ochiai |
| 7,285,015 B2 | 10/2007 | Helbok et al. |
| 7,347,698 B2 | 3/2008 | Dittmann |
| 7,354,276 B2 | 4/2008 | Dittmann |
| 7,357,644 B2 | 4/2008 | Dittmann |
| 7,371,073 B2 | 5/2008 | William |
| 7,383,632 B2 | 6/2008 | Dittmann |
| 7,405,364 B2 * | 7/2008 | Nair et al. ..................... 174/260 |
| 7,438,563 B2 * | 10/2008 | Chung et al. ..................... 439/91 |
| 7,537,459 B2 * | 5/2009 | Takegahara et al. ............ 439/66 |
| 7,540,081 B2 | 6/2009 | Kumar et al. |
| 7,552,530 B2 | 6/2009 | Mueller |
| 7,597,561 B2 | 10/2009 | Radza et al. |
| 7,621,756 B2 | 11/2009 | Dittmann |
| 7,621,761 B2 * | 11/2009 | Mok et al. ........................ 439/81 |
| 7,625,220 B2 | 12/2009 | Dittmann et al. |
| 7,628,617 B2 * | 12/2009 | Brown et al. .................... 439/66 |
| 7,645,147 B2 | 1/2010 | Dittmann |
| 7,758,351 B2 | 7/2010 | Brown et al. |
| 7,771,208 B2 * | 8/2010 | Hougham et al. ............... 439/66 |
| 7,891,988 B2 | 2/2011 | Dittmann et al. |
| 7,989,945 B2 | 8/2011 | Williams et al. |
| 8,007,287 B1 * | 8/2011 | Champion et al. ............... 439/66 |
| 8,033,835 B2 * | 10/2011 | Mulfinger et al. ............... 439/66 |
| 8,070,496 B2 * | 12/2011 | Li et al. ............................ 439/66 |
| 8,113,852 B2 * | 2/2012 | Tamura ............................ 439/66 |
| 8,137,113 B2 * | 3/2012 | Ouchi et al. ..................... 439/66 |
| 8,179,692 B2 * | 5/2012 | Ihara ............................. 361/787 |
| 8,333,597 B2 * | 12/2012 | Tamura ............................ 439/66 |
| 8,334,595 B2 * | 12/2012 | Jung ............................. 257/738 |
| 2001/0001080 A1 | 5/2001 | Eldridge et al. |
| 2001/0016435 A1 * | 8/2001 | Fujimura ......................... 439/66 |
| 2001/0016436 A1 * | 8/2001 | Wimmer ......................... 439/66 |
| 2001/0024890 A1 | 9/2001 | Maruyama et al. |
| 2002/0006744 A1 | 1/2002 | Tashiro |
| 2002/0008966 A1 | 1/2002 | Fjelstad et al. |
| 2002/0011859 A1 | 1/2002 | Smith et al. |
| 2002/0055282 A1 | 5/2002 | Eldridge et al. |
| 2002/0055289 A1 | 5/2002 | Murakami et al. |
| 2002/0058356 A1 | 5/2002 | Oya |
| 2002/0079120 A1 | 6/2002 | Eskildsen et al. |
| 2002/0117330 A1 | 8/2002 | Eldridge et al. |
| 2002/0129866 A1 | 9/2002 | Czebatul et al. |
| 2002/0129894 A1 | 9/2002 | Liu et al. |
| 2002/0133941 A1 | 9/2002 | Akram et al. |
| 2002/0146919 A1 | 10/2002 | Cohn |
| 2002/0173175 A1 * | 11/2002 | Brodsky et al. ................. 439/66 |
| 2002/0178331 A1 | 11/2002 | Beardsley et al. |
| 2002/0179331 A1 | 12/2002 | Brodsky et al. |
| 2003/0000739 A1 | 1/2003 | Frutschy et al. |
| 2003/0003779 A1 | 1/2003 | Rathburn |
| 2003/0008548 A1 | 1/2003 | Ueda et al. |
| 2003/0013341 A1 | 1/2003 | Urbaniak et al. |
| 2003/0022503 A1 | 1/2003 | Clements et al. |
| 2003/0029907 A1 | 2/2003 | Neidich et al. |

(56) References Cited

U.S. PATENT DOCUMENTS

| | | | |
|---|---|---|---|
| 2003/0035277 A1 | 2/2003 | Saputro et al. | |
| 2003/0049951 A1 | 3/2003 | Eldridge et al. | |
| 2003/0064635 A1 | 4/2003 | Ochiai | |
| 2003/0089936 A1 | 5/2003 | McCormack et al. | |
| 2003/0092293 A1 | 5/2003 | Ohtsuki et al. | |
| 2003/0096512 A1 | 5/2003 | Cornell | |
| 2003/0099097 A1 | 5/2003 | Mok et al. | |
| 2003/0129866 A1 | 7/2003 | Romano et al. | |
| 2003/0139071 A1* | 7/2003 | Li et al. | 439/66 |
| 2003/0147197 A1 | 8/2003 | Uriu et al. | |
| 2003/0194832 A1 | 10/2003 | Lopata et al. | |
| 2004/0029411 A1 | 2/2004 | Rathburn | |
| 2004/0033717 A1 | 2/2004 | Peng | |
| 2004/0072456 A1 | 4/2004 | Dozier et al. | |
| 2004/0072467 A1 | 4/2004 | Jordan et al. | |
| 2004/0118603 A1 | 6/2004 | Chambers | |
| 2004/0127073 A1 | 7/2004 | Ochiai | |
| 2004/0166702 A1* | 8/2004 | Higashi | 439/66 |
| 2004/0229506 A1 | 11/2004 | Asao | |
| 2005/0020125 A1 | 1/2005 | Huang | |
| 2005/0042896 A1 | 2/2005 | Huang | |
| 2005/0088193 A1 | 4/2005 | Haga | |
| 2005/0099193 A1 | 5/2005 | Burgess | |
| 2005/0099763 A1 | 5/2005 | Rathburn | |
| 2005/0142900 A1 | 6/2005 | Boggs et al. | |
| 2005/0161797 A1 | 7/2005 | Miller | |
| 2005/0164527 A1 | 7/2005 | Radza et al. | |
| 2005/0167816 A1 | 8/2005 | Khandros et al. | |
| 2005/0196979 A1* | 9/2005 | Fedde et al. | 439/66 |
| 2005/0208785 A1* | 9/2005 | Kuczynski et al. | 439/66 |
| 2005/0208788 A1 | 9/2005 | Dittmann | |
| 2005/0233609 A1* | 10/2005 | Rathburn | 439/66 |
| 2005/0260868 A1* | 11/2005 | Lee | 439/66 |
| 2005/0287828 A1 | 12/2005 | Stone et al. | |
| 2006/0028222 A1 | 2/2006 | Farnworth et al. | |
| 2006/0113107 A1 | 6/2006 | Williams | |
| 2006/0121756 A1 | 6/2006 | Kuo et al. | |
| 2006/0128207 A1 | 6/2006 | Zhang et al. | |
| 2006/0154497 A1* | 7/2006 | Amemiya et al. | 439/66 |
| 2006/0160379 A1* | 7/2006 | Rathburn | 439/66 |
| 2006/0173425 A1 | 8/2006 | Meierhoefer | |
| 2006/0189179 A1 | 8/2006 | Dittmann et al. | |
| 2006/0228933 A1 | 10/2006 | Liu et al. | |
| 2006/0276059 A1 | 12/2006 | Dittmann et al. | |
| 2006/0281361 A1 | 12/2006 | Uchida et al. | |
| 2007/0020960 A1* | 1/2007 | Williams | 439/66 |
| 2007/0050738 A1 | 3/2007 | Dittmann | |
| 2007/0054515 A1 | 3/2007 | Williams | |
| 2007/0054544 A1 | 3/2007 | Hirata | |
| 2007/0054545 A1 | 3/2007 | Takahira | |
| 2007/0105433 A1 | 5/2007 | Shioda et al. | |
| 2007/0123074 A1 | 5/2007 | Nishimura | |
| 2007/0134949 A1 | 6/2007 | Dittmann | |
| 2007/0141863 A1 | 6/2007 | Williams | |
| 2007/0178751 A1 | 8/2007 | Yamamoto | |
| 2007/0218710 A1 | 9/2007 | Brown et al. | |
| 2007/0245553 A1* | 10/2007 | Chong et al. | 29/843 |
| 2007/0259539 A1 | 11/2007 | Brown et al. | |
| 2007/0269997 A1 | 11/2007 | Eldridge et al. | |
| 2007/0275572 A1 | 11/2007 | Williams et al. | |
| 2007/0275579 A1 | 11/2007 | Si et al. | |
| 2007/0298626 A1* | 12/2007 | Hougham et al. | 439/66 |
| 2008/0045076 A1 | 2/2008 | Dittmann et al. | |
| 2008/0050958 A1 | 2/2008 | Hashiguchi et al. | |
| 2008/0076282 A1 | 3/2008 | Yamaji et al. | |
| 2008/0134502 A1 | 6/2008 | Dittmann | |
| 2008/0171452 A1* | 7/2008 | Yakabe et al. | 439/66 |
| 2009/0042414 A1* | 2/2009 | Hougham et al. | 439/66 |
| 2009/0053908 A1* | 2/2009 | Hougham et al. | 439/66 |
| 2009/0102500 A1* | 4/2009 | An et al. | 324/761 |
| 2009/0189624 A1* | 7/2009 | Oh et al. | 324/754 |
| 2009/0193654 A1 | 8/2009 | Dittmann | |
| 2010/0055941 A1 | 3/2010 | Dittmann et al. | |
| 2010/0075514 A1 | 3/2010 | Williams | |
| 2010/0167561 A1 | 7/2010 | Brown et al. | |
| 2011/0070750 A1* | 3/2011 | Reisinger et al. | 439/66 |
| 2012/0156899 A1* | 6/2012 | Jeon et al. | 439/66 |
| 2013/0029500 A1* | 1/2013 | Fan et al. | 439/66 |

FOREIGN PATENT DOCUMENTS

| | | |
|---|---|---|
| EP | 1280241 A1 | 1/2003 |
| EP | 1005086 B1 | 9/2003 |
| EP | 839321 B1 | 1/2006 |
| WO | 96/02068 A1 | 1/1996 |
| WO | 97/43653 A1 | 11/1997 |
| WO | 97/44859 A1 | 11/1997 |
| WO | 02/13253 A1 | 2/2002 |
| WO | 2007/056169 A2 | 5/2007 |

OTHER PUBLICATIONS

Kromann, et al., "Motorola's PowerPC 603 and PowerPC 604 RISC Microprocessor: the C4/Ceramic-ball-grid Array Interconnect Technology", Motorola Advanced Packaging Technology, Motorola Inc.,(1996), 10 Pgs.

Mahajan, et al., "Emerging Directions for packaging Technologies", Intel Technology Journal, V. 6, Issue 02, (May 16, 2002),pp. 62-75.

Suppa, "Via Hole Plugging of SBU PCBs: Trends, Possibilities, Application and Processing as Well as Limitations", Report No. 154 E; Lackwerke Peters GmbH Speziallacke fur die Elekronik; LP023007 E-O; Ref 154e.0, Supplemented and revised version of the paper presented at the DVS/GMM Convention regarding the topic "Electronic Assemblies—Build-up and Process Technology.",(Feb. 6 and 7, 2002),19 pgs.

Williams "Contact Grid Array System", Patented Socketing System for the BGA/CSP Technology, E-tec Interconnect Ltd.,(Jun. 2006),1-4 Pgs.

* cited by examiner

ELECTRICAL CONNECTOR AND METHOD OF MAKING IT

BACKGROUND OF THE INVENTION

1. Field of Invention

The present invention relates to an improved electrical connector and method of making it. More specifically, the present invention relates to an electrical connector comprising elastic contacts on an insulating substrate, in which vias or holes in the insulating substrate are filled to provide a better connector performance and improved ease of manufacturing.

2. Background Art

Electrical connectors are an important component of many electronic devices. As the devices become smaller, the functionality is increasing, requiring increasing numbers of electrical interconnections between components. In order to enable system miniaturization, the electrical connectors must become smaller, yet they are required to handle increasing power and signal loads and to operate at faster speeds. It is necessary in many applications to provide a low-cost, high reliability electrical interconnection on an extremely small scale to allow for an increasing number of components to be interconnected. As the operating frequencies and data transfer rates of the electronic system increases, there is an increased need for high speed signal integrity through the connector.

Various electrical connectors have been proposed in the prior art. Examples of such electrical connector (electrical interconnection) is shown in Neoconix' prior patents such as U.S. Pat. No. 7,113,408.

Conventional electrical connectors present challenges in terms of their size, cost, and operating speed. A conventional connector has a substantial size and a significant cost to manufacture, especially when the connector includes many electrical contacts. Such connectors also must operate at speeds which are increasing without losing data as a result of the electrical connections. Power handling requirements are also increasing. Conventional connectors are limited in power handling capability, and can overheat when power load exceeds their capability. These conventional connectors are typically lacking in their ability to dissipate heat or to conduct heat away from the mating components.

Further, many electrical connectors utilize precious metal surface finishes, such as gold, to prevent corrosion. These materials are costly. As a result there is a desire to use smaller connections (to take up less space and to use less precious material), and to minimize the surface area which must be finished with the precious metals.

Electronic devices and particularly portable electronic devices are susceptible to corrosion and degradation from liquids or gases from the environment that penetrate the system. Electrical connectors typically have a high density of electrical interconnections, and it is difficult to shield these from the environment while maintaining connector separability. In contrast, interconnections on a packaged semiconductor can be over-molded or under-filled to protect the interconnections from moisture, water, or gas ingress. Hence, the electrical connector tends to be a highly susceptible component from the perspective of water ingress or damage from corrosive environments.

Accordingly, it will be apparent that the prior art electrical connectors have limitations and undesirable characteristics.

SUMMARY OF THE INVENTION

The present invention overcomes the limitations and disadvantages of the prior art electrical connectors and methods of making them.

The present invention is an improved electrical connector and method of making it in which the electrical connector may have dense interconnections, and which provides high reliability interconnections, low resistance and high current carrying capacity, improved thermal dissipation, reduced precious metal usage during fabrication, and thin electrical conductors while providing improved protection for the electrical interconnections. This method and connector will allow for smaller scale interconnections and greater reliability of the interconnection while providing improved signal integrity at high frequency and an economical electrical connector to manufacture.

Other objects and advantages of the present invention will be apparent to those skilled in the relevant art in view of the following description of the preferred embodiment and the accompanying drawings.

BRIEF DESCRIPTION OF THE DRAWINGS

FIG. 8c is a front view of a contact pad array on a PCB to which an electrical connector (or interposer), shown in perspective view of FIG. 8a, would mate, FIG. 8b is an enlarged perspective view from a different angle of a portion of the electrical connector (interposer) of FIG. 8a, showing details of its contact array and FIG. 8d is a cross-sectional view depicting one application of that electrical connector.

DETAILED DESCRIPTION OF THE PREFERRED EMBODIMENT

Figure 1:
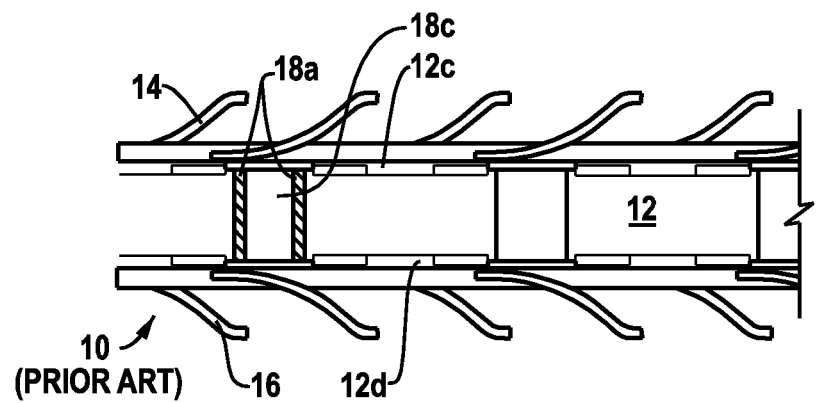
FIG. 1 illustrates one form of prior art electrical connector in an enlarged, cut-away or sectional view.

FIG. 1 is an enlarged and cross-sectional view of a portion of an electrical connector 10 of the prior art, such as is described in U.S. Pat. No. 7,113,408 owned by assignee of the present invention, Neoconix. The electrical connector as shown in this view the electrical connector 10 has a substrate 12 a plurality of electrical contacts 14 mounted on a top surface 12a of the substrate 12 and a plurality of contacts 16 mounted on a bottom surface 12b of the substrate 12. The electrical contacts 14 and 16 are typically formed from an initially flat sheet of conductive material which has been formed into a three-dimensional shape in a batch process (as described in U.S. Pat. No. 7,758,351, owned by the assignee of the present invention), with the sheet of electrical contacts then secured to the substrate 12 in a single operation, then singulated in a conventional process (such as a chemical etching process).

The substrate 12 is typically non-conducting and made starting with a printed circuit board (PCB) material such as a sheet of copper-clad FR4. The substrate 12 as shown in this FIG. 1 includes a plurality of through holes 18 which are formed in a conventional manner. The through holes 18 (which are also sometimes referred to as apertures or vias and may extend completely through the substrate 12 or only partially through the substrate 18, terminating at an intermediate layer of the substrate 18) are plated in a conventional manner to provide an electrically conductive via 18a through the substrate 12. The copper cladding and plating material also provides conductor portions 12c, 12d on the top and bottom surfaces 12a, 12b to provide an electrically-conductive path on these surfaces of the substrate 12 to electrically couple selected electrical contacts 14, 16, 12c and 12d are electrically connected to the plated via which provides a conductive path between 12 c and 12 d.

The plated through holes are typically formed through a drilling process followed by a process to make the hole walls electrically conductive, after which the hole walls are plated through a chemical or electrochemical process which allows for the wall of the electrically conductive via 18a to be of a controlled thickness to provide sufficient conductivity and reliability. The standard through hole or via 18 with plating 18a of the prior art electrical connectors is thus not filled completely, but only around the periphery of the cylindrical opening, having a hollow or open center portion, represented by the reference numeral 18c.

Figure 2:
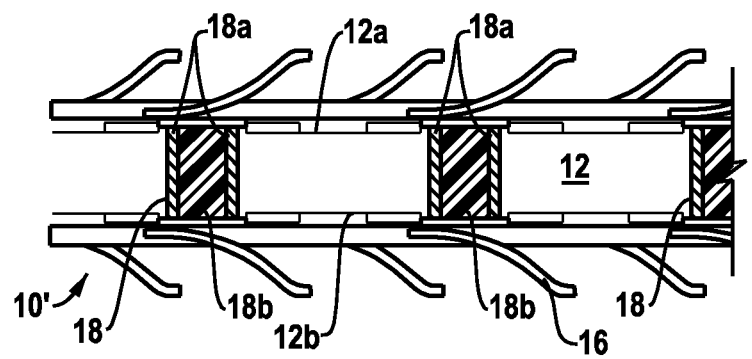
FIG. 2 illustrates one form of an electrical connector of the present invention in an enlarged, cut-away or sectional view.

FIG. 2 illustrates an electrical connector 10' of the present invention which is a modified version of the connector 10 of FIG. 1. In this view, the connector 10' includes a substrate 12 with a plurality of through holes 18 and a plurality of electrical contacts 14 mounted to the top surface 12a of the substrate 12 and a plurality of electrical contacts 16 mounted to the lower or bottom surface 12b of the substrate 12. A first conductive material (a plating material) is shown applied to the aperture to provide the plating layer 18a as an electrical connection with selected electrical contacts 14, leaving a cylinder-shaped opening within the aperture 18. A fill material 18b substantially fills the cylinder-shaped void, providing a covering and sealing material over at least a portion of the plating material 18a within the aperture 18.

The preferred fill material 18b for many applications of the present invention is thermosetting epoxy, a plastic material. However, other materials can be used to advantage in the present invention including other thermo-setting materials (such as acrylic, polyimide, or Bakelite) or thermoplastic material (such as PMMA, thermoplastic polyimide, or LCP). Other materials which could be used to advantage as the fill material 18b in the present invention include solder mask, fluoropolymers, and other polymers and blends of polymers. The via fill material 18b also can be a composite polymeric material including particulate or fiber filler materials such as glass fibers, alumina, silicon carbide, magnesium oxide, or silicon dioxide (silica) particles to control thermal expansion or to increase thermal conductivity, where silica is particularly useful in mixtures to achieve a desired coefficient of thermal expansion. The via fill material also can include conductive fillers such as silver flake or metal particles including gold, copper and/or silver to improve conductivity and/or reliability. In yet some other applications, a via fill material can be an electrically conductive material—a metal such as copper or an alloy such as solder. The filler could include copper which has been plated sufficiently to completely fill the via. The solder filler could be created by printing solder paste into the vias, then reflowing to create a solder via fill.

The via fill material 18b can provide a mechanical strengthening of the electrical connection provided by the plated via. This via fill material reduces the stress on the via plating layer 18a during electrical connector operation, including reducing stress during thermal cycling or during activation of the electrical connector (for example, from flexing of the electrical connection structure or from expansion and contraction of the substrate 12). The present invention also contemplates that the via fill material might provide a sealed connector in some applications, including with a separate seal such as an o-ring, if desired. A sealed connector provided by (or in conjunction with) the via fill material can protect the sensitive electronic components inside of an electronic device from gases and liquids which might erode or corrode the electronic components and reduce the effectiveness and the useful life of the electronic system.

The via fill material 18b may be chosen based on the application under consideration. In some cases, it is desirable to have a coefficient of thermal expansion which is selected based on the coefficient of the plating material (approximately equal to that of the plating material). In other applications, it is desirable to have a coefficient of thermal expansion which is approximately the same as the coefficient of thermal expansion of the substrate. In still others, it is desirable to have a coefficient of thermal expansion which is approximately the average of the coefficients of thermal expansion of the plating material and the substrate.

The via fill material 18b might be thermally conductive in other applications. This can be accomplished by using thermally conductive fillers in the via fill material, such as metals (for example copper) and certain ceramic materials (for example boron nitride, aluminum nitride, or aluminum oxide). Using a thermally conductive fill material would improve the heat transfer through the electrical connector 10' and reduce the heat retained at the electrical interconnections or transferred to the mating components, which may be heat sensitive. This can effectively increase the current carrying capacity of the connector, and as a result may reduce the number of high power interconnections required and/or improve the reliability of the system.

The via fill material 18b might be electrically conductive in certain other applications. This can be accomplished by including a metal (such as copper, silver, or gold) or a metallic alloy (such as solder) within the fill material. This type of material can reduce the electrical resistance through the electrical connector 10', enabling high current carrying capability. This increased current carrying capacity can reduce the number of connector contacts ("pins" or "positions") required to provide sufficient power to a device or system element. This can also reduce the heat generation due to resistive heating and can also improve signal integrity.

Because the elastic contacts commonly require surface finishing with a precious metal such as gold, to ensure low contact resistance and prevent corrosion, and the surface finishing frequently occurs subsequent to attachment of the contacts to the substrate, the via or plated through hole will typically incidentally be plated with the precious metal, increasing gold usage. The via fill material prevents the walls of the via from being plated with the precious metal, reducing the surface area being plated and hence reducing precious metal usage and therefore fabrication cost.

In a connector structure where all of the vias are filled, the connector structure may be sealed from side to side and prevents moisture or water ingress through the connector structure. By sealing the perimeter of the connector to another component or element of the electronic system, a watertight connector can be achieved. This is a significant advantage, for example, for battery connectors for cell phones, where the battery side of the connector may have significantly higher likelihood of exposure to water than the electronic components within the main body of the phone housing. The sealed connector would prevent water ingress from the battery side of the connector into the main body of the phone, where sensitive electronic devices inside including semiconductor devices such as processor chips, memory chips, and logic chips reside.

The present invention is related to electrical connectors in general and is not limited to electrical connectors having a plurality of spring contacts on the top and bottom of the electrical connector, and it is not limited to a connector having electrical contacts on both top and bottom portions of the connector. So, in place of one set of the electrical contacts, an array of surface mount pads could be employed. In the alternative, the contacts could be a ball grid array (BGA), if desired.

Figure 3:
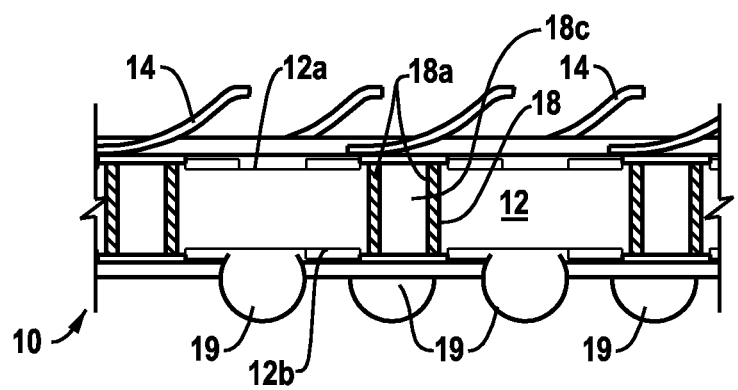
FIG. 3 illustrates a second form of prior art electrical connector in a cut-away or sectional view.

FIG. 3 illustrates the use of a ball grid array (BGA) contacts 19 in the electrical connector 10 of the prior art. The electrical connector 10 includes the substrate 12 with its top surface 12a and its bottom surface 12b, with a plurality of spring electrical contacts 14 on the top surface 12a. The substrate 12 includes a plurality of through holes or vias 18 with plating 18a on the vias or through holes, leaving a void or open space 18c within the vias 18. A grid array of balls 19 is mounted to the bottom surface 12b in a conventional manner of soldering the balls in place. However, since the solder would wick into the apertures if the balls were located over a via 18 with its open void 18c or in close proximity thereto, these balls 19 must be spaced from the open vias 18 of this electrical connector 10.

Figure 4:
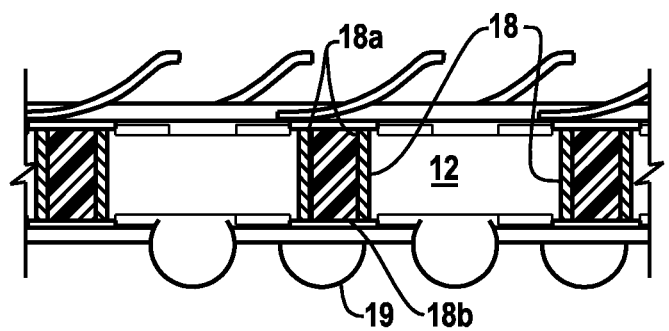
FIG. 4 illustrates a second form of an electrical connector of the present invention in a cut-away or sectional view.

FIG. 4 illustrates the electrical connector 10' of the present invention with such an array of electrically conductive balls 19 mounted to the lower surface 12b of the substrate 12. The apertures or vias 18 through the substrate 12 have been plated with a plating material 18a and the rest of the aperture has been filled with the fill material 18b. The fill material 18b prevents the solder from wicking into the hole, allowing the placement of a solder ball 19 over an aperture or in close proximity thereto.

Figure 5:
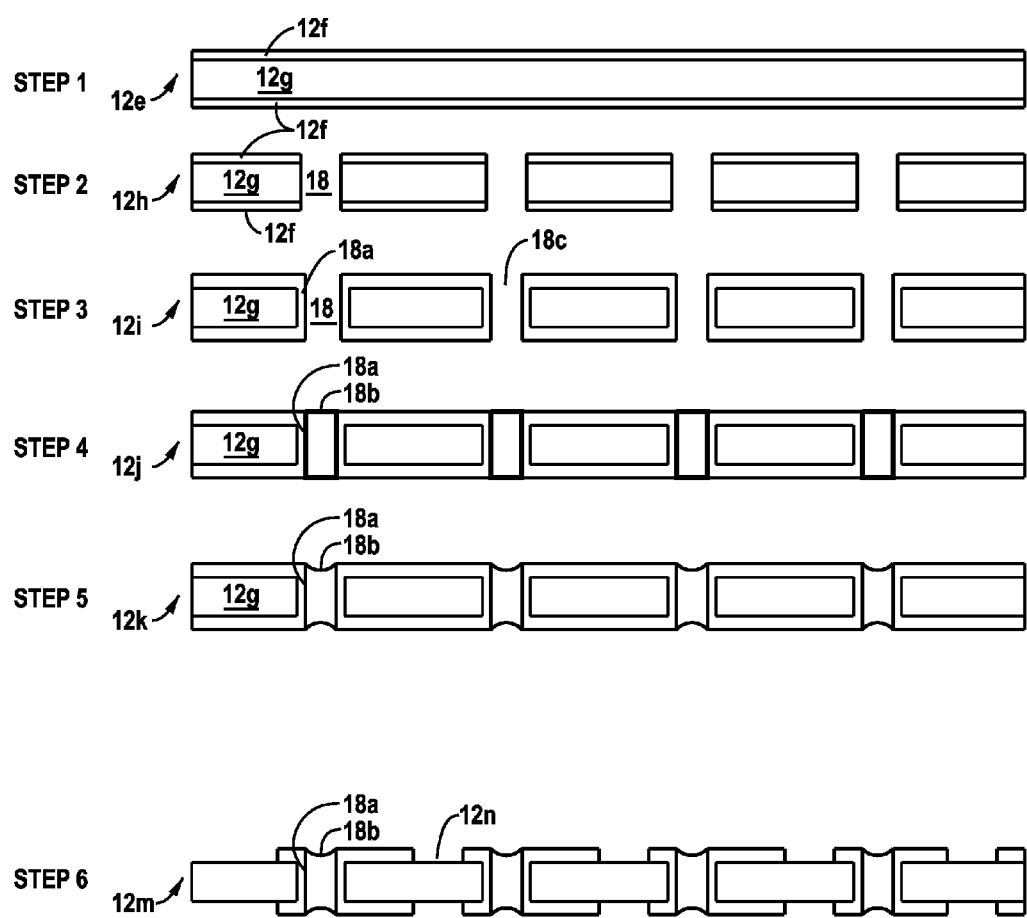
FIG. 5 illustrates portions of the electrical connector of FIG. 2 or 4 as one example of manufacturing progression using the method of the present invention.

FIG. 5 illustrates the substrate of the electrical connector of the present invention as it progresses through one typical manufacturing process, up to but not including the attachment of the sheet of elastic contacts to the substrate. Many variations on this manufacturing process can be made and additional steps can be inserted if desired for particular applications. In step 1, a copper clad FR4 printed circuit board substrate 12e is shown as the starting material, with layers 12f of copper on top and bottom of the insulating material 12g. In step 2, a substrate 12h is shown after the apertures or vias 18 (sometimes called through holes) have been formed, preferably using a drilling process. At step 3 a substrate 12i is shown after the seeding and plating process has formed plated paths 18a through at least some of the vias 18, but leaving the open region or void 18c within the aperture 18 adjacent to the plating 18a. At step 4, a substrate 12j is shown with fill material 18b inserted into the void 18c of step 3. At step 5, the fill material 18b is cured and shrinks and the surfaces (top and bottom, as desired) may be cleaned mechanically or chemically to remove residual material such as resin from the surface of the fill material 18b. At step 6, the substrate 12m now has undergone circuit formation through the use of a "print and etch" process. Portions of the conductive material at 12n have been removed to provide the circuit in the desired interconnection in a well known manner.

Of course, it will be understood that many variations to this process are possible without departing from the spirit of the present invention. So, for example, if the fill material 18b does not substantially shrink during the cure process, planarization may be necessary (e.g., by mechanical abrasion) so that the hole fill 18b surfaces have the desired relationship to the surface of the substrate. If the fill material shrinks too much, then an additional fill step might be desired to bring the level of the fill material to the desired level. If it is desired to have the fill material 18b recessed from the surface of the substrate—for example, to prevent interference with the movement of the spring contacts—the surface of the substrate can be plated with copper in selected locations.

Figure 6:
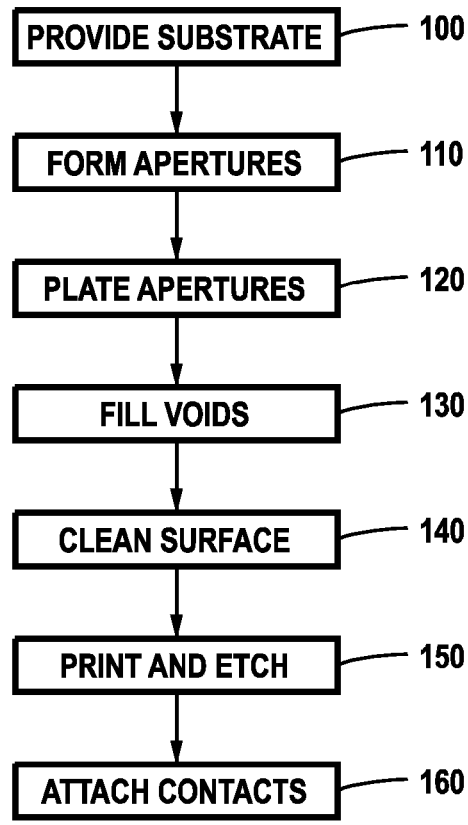
FIG. 6 is a flow chart illustrating one process for making the electrical connector of the present invention.

FIG. 6 illustrates the steps of one preferred process for making the electrical connector of the present invention. The process begins with the substrate 12 at step 100, with the preferred substrate being printed circuit board with copper cladding. At step 110 the apertures or vias 18 are formed, preferably using a drilling process. This drilling process could include mechanical drilling, laser drilling, plasma drilling, or other means of hole making. Next at step 120, the apertures 18 are seeded and plated using conventional methods, forming vias 18 with a conductive coat 18a and a cylinder-shaped openings 18c. The cylinder-shaped openings 18c in the vias 18 are filled using a second material at the step 130. This fill process can be accomplished by several means, including screen printing, stencil printing, and dispensing. Screen printing can be done from one side or from both sides of the substrate and with or without vacuum assist to help pull the fill material into the vias. In many applications it is preferred to use a single-sided screen printing using vacuum assist to ensure complete filling of the apertures 18 (where the plating does not fill the via or aperture). Of course, there are other ways to insert the fill material within the voids, including dispensing it and stencil printing it. After the fill material is positioned within the aperture, the preferred method of filling the voids involves heating the fill material to cure it, if it is a thermoset polymer or filled thermoset polymer, or to reflow it if it is a solder paste or thermoplastic polymer, to permanently fill the voids. It is also possible to cure the fill material with ultraviolet (UV) radiation, if a UV curable polymer is used as the fill material. The cure processes stabilizes and solidifies the fill material. The surface of the processed substrate 12 is then cleaned at step 140, preferably using a plasma cleaning process, although a chemical or mechanical cleaning are also possible. Now, the fill material may be in an acceptable position as a result of this processing or it may require planarization. If the fill material protrudes above the surface of the plated, copper clad substrate, a planarization operation will likely be required, such as abrasive sanding, brushing, plasma etching, or polishing, to flatten the fill material so it is coplanar with or slightly recessed from the surface of the copper. If the fill material shrinks substantially during curing, it may be recessed from the surface of the plated, copper clad substrate. It is possible a second via filling process may be required to fully fill the via. At the step 150 printing and etching is done to provide a surface with the appropriate conductive attachments. Alternatively, a pattern plating process or semi-additive circuit formation process can be used to provide the appropriate conductive attachments. Then at step 160 the elastic contacts are attached to the conductive attachments, preferably by positioning the sheet of elastic contacts in the proper location, bonding and interconnecting the sheet of electrical contacts, then singulating the contacts.

Finally, if some further finishing of the surface of the fill material is required or desired, it may be done, such as adding a metallization layer on top of the fill material (which can be accomplished through plating or other suitable methods).

Figure 7:
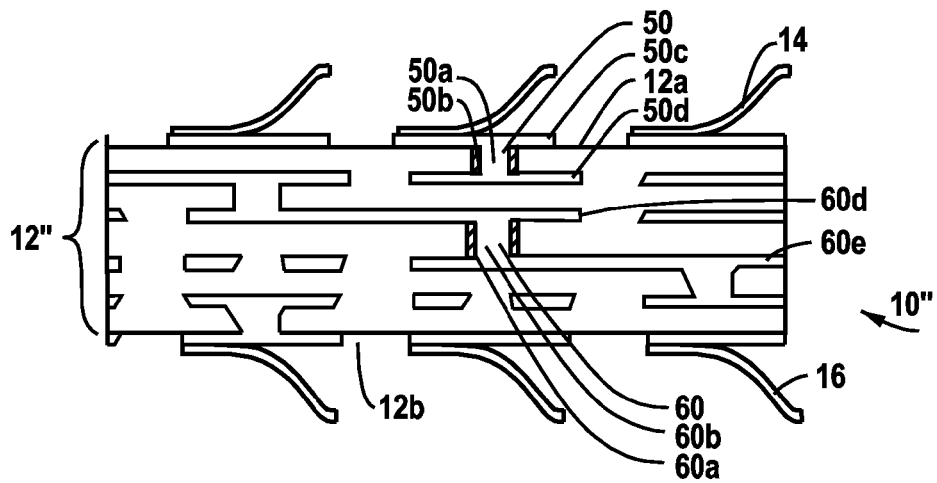
FIG. 7 is a cross-sectional view of an electrical connector which illustrates other uses for the present invention on multilayer printed circuit structures containing blind and/or buried interconnections.

FIG. 7 illustrates a variation on the present invention wherein the electrical connector includes a multilayer printed circuit board (PCB). This electrical connector 10" includes a PCB or substrate 12" having multiple conductive lawyers separated by insulating layers made in a conventional, known manner. The substrate 12" has its top surface 12a and its bottom surface 12b each having electrical contacts 14, 16 mounted thereon. As shown in this view, there is a blind via 50 and a buried via 60 illustrated in this view, where the blind via 50 is beneath a connection plate and the buried via is between two internal conductive layers 60c, 60d of the substrate 12". The filling of the blind via 50 includes a conductive material 50a and a second material 50b which fills the rest of the hole (the void). The filling of the buried via 60 includes a conductive material 60a and a second material 60b filling the void of this via. While the filling of the blind vias on the outer layers of the substrate provides the advantages listed above, the filling of the buried via is optional and depends on the circuit layout and the nature of the multilayer printed circuit board fabrication process.

Figure 8A:
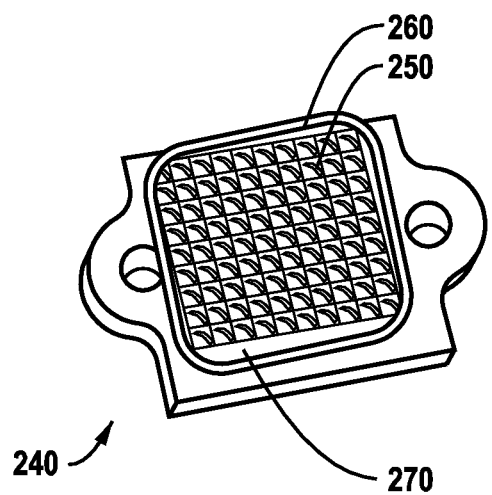
FIGS. 8a, 8b, 8c and 8d illustrate applications for the use of the present invention to create a sealed electrical connector, where

FIG. 8a is a perspective view of an electrical connector (or interposer) 240 which provides interconnections including board-to-board or flex-to-board electrical interconnections. A plurality of electrical spring contacts 250 are arranged in an array on the electrical connector (interposer) 240, where the electrical spring contacts 250 are preferably the spring contacts of the type sold by Neoconix under its PCBeam trademark and described in its issued patents. A seal 260 surrounds the array of electrical contacts 250, with the seal 260 being a conventional o-ring or other suitable seal. The seal 260 could also be comprised of the coverlay material 270, where the coverlay in this instance would be substantially compliant, such as an elastomeric material like silicone. When the electrical connector (interposer) 240 is mated to and compressed against the substrate, the seal 260 forms a watertight barrier to fluid penetration. Not shown in this view are the filled vias, which also contribute to forming the watertight connector by preventing water ingress or egress through the vias.

Figure 8B:
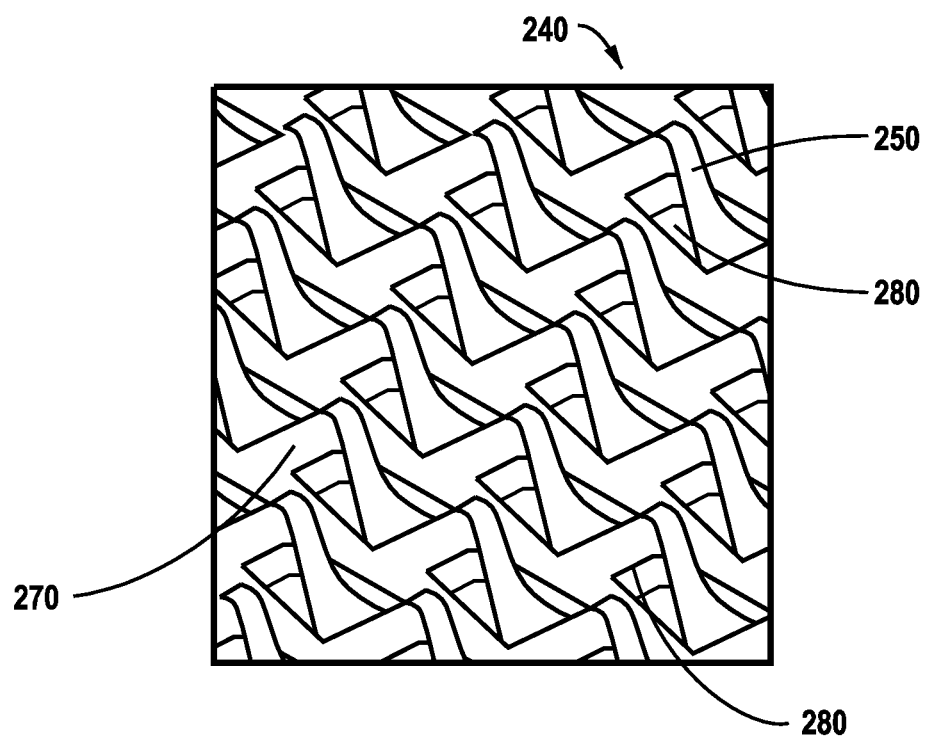

FIG. 8b shows the detail of a portion of the electrical connector (interposer) 240 with some of the electrical spring contacts 250 which are mounted such that their base portion is located under a coverlay 270. Spring contacts 250 are located in openings 280 in the coverlay 270. Not shown in this view are the filled vias of the present invention which cooperate with the other structures to assist in prevention of moisture or water penetration while protecting the electrical interconnections provided by plating of the vias.

Figure 8C:
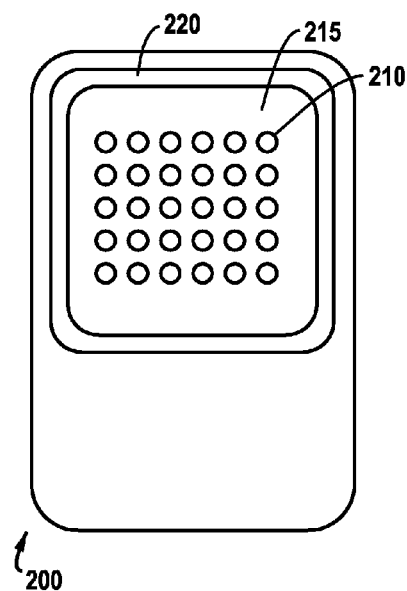

FIG. 8c shows a mating substrate 200 having a 6×5 array of contact pads 210 arranged on a PCB or flex circuit substrate 215. An optional copper seal ring 220 surrounds the contact pads 210. The contact pads 210 are electrically connected by internal vias to electronic circuits on and/or within the substrate. The copper seal ring 220 helps provide a seal by providing a raised surface which compresses against compliant seal on the electrical connector 240 of FIGS. 8a and 8b, such as an o-ring or other compliant member, during actuation of the connector to the substrate 215. The seal formed between the substrate and the connector outside of the contact array, in conjunction with filled vias in the connector interposer, restricts the passage of fluids, such as water or moisture, protecting the electrical connections.

Figure 8D:
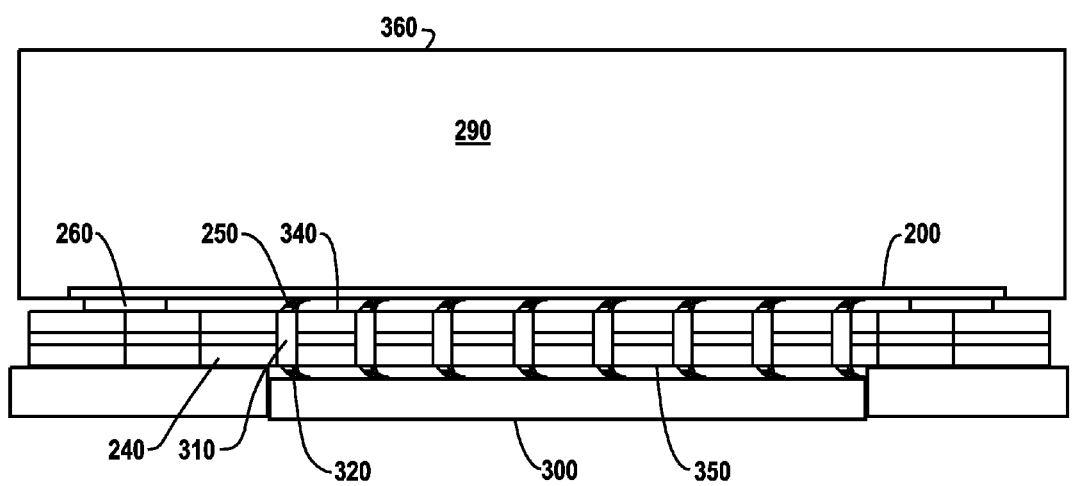

FIG. 8d shows one representative example of the electrical connector (or interposer) 240 to form a watertight electrical interconnection to the inside of a sealed electronic system 290 surrounded by a housing, 360. A seal 260 surrounds the contact array and is compressed between the electrical connector (or interposer) 240 and the mating printed circuit substrate 200, and/or the housing. The filled vias 310 prevent water ingress through the connector (interposer) 240, and electrically interconnect electrical contacts 250 on a first surface 340 of the electrical connector (or interposer) 240 to electrical contacts 320 on a second surface 350 of the connector (or interposer) 240. An electrical interconnection is made between the electrical contacts 250 on the first surface 340 of the connector (interposer) 240 and mating pads (not shown) on the printed circuit substrate 200. On the second surface 350 of the connector (interposer) 240, electrical interconnections are made between the electrical contacts 320 and a device 300, such as a battery, power supply, or antenna, located outside of the sealed electronic system 290, and thus potentially exposed to the outside environment 330.

Many modifications and alterations of the preferred embodiment described above are possible without departing from the spirit of the present invention. For example, the filled via can be created using a plating or etching process to create a copper or other metal post or pillar on the surface of a carrier sheet, and this post can be inserted into a hole in the nonconductive substrate material to create the solid or filled via. Such a post or pillar could also directly pierce a non-conductive substrate which does not have pre-existing holes within it. Further, some of the features of the present invention can be used to advantage without the corresponding use of other features. For example, the use of an abrasion of the fill of the vias may be desirable in some instances and not required in other instances. Accordingly, the foregoing description of the preferred embodiment should be considered as merely illustrative of the principles of the present invention and not in limitation thereof, as the claims which follow are the sole definitions of the present invention.

Having thus described the invention, what is claimed is:

1. An electrical connector comprising:
   A substrate having a first surface and a second surface and carrying electrical contacts on at least one surface and a plurality of apertures extending between the first surface and the second surface;
   An electrically-conductive material which extends through at least one of the plurality of apertures and electrically couples the first surface and the second surface; and
   An additional material in addition to the conductive material which fills at least one of the plurality of apertures, said additional material filling the aperture to seal at least a portion of the electrically-conductive material from exposure to the environment outside the substrate, said additional material chosen to have a coefficient of thermal expansion approximating the coefficient of thermal expansion of at least one of the substrate and the electrically-conductive material.

2. An electrical connector of the type described in claim 1 wherein the additional material is chosen to have a coefficient of thermal expansion approximating the coefficient of thermal expansion of the electrically-conductive material.

3. An electrical connector of the type described in claim 1 wherein the additional material is chosen to have a coefficient of thermal expansion approximating the coefficient of thermal expansion of the substrate.

4. An electrical connector of the type described in claim 1 wherein the additional material is chosen to have a coefficient of thermal expansion between the coefficient of thermal expansion of the substrate and the coefficient of the electrically-conductive material.

5. An electrical connector of the type described in claim 1 wherein the additional material is electrically conductive.

6. An electrical connector of the type described in claim 1 wherein the additional material includes a thermosetting epoxy material.

7. An electrical connector of the type described in claim 6 wherein the thermosetting epoxy material is filled with silica particles.

8. An electrical connector of the type described in claim 7 wherein the thermosetting epoxy material is filled with a material with high thermal conductivity.

9. An electrical connector of the type described in claim 1 wherein the additional material includes a fusible metal.

10. An electrical connector of the type described in claim 1 wherein at least one of the apertures is a buried via which contains a conductive material and a fill material.

11. An electrical connector of the type described in claim 1 wherein at least one of the apertures is a blind via which contains a conductive material and a fill material.

12. A method of making an electrical connector comprising the steps of:
Providing a connector substrate with a plurality of apertures;
Coupling at least one electrical component to the substrate;
Providing an electrically-conductive path through at least one of the apertures;
Choosing an additional material which has a coefficient of thermal expansion approximating the coefficient of thermal expansion of at least one of the substrate and the electrically-conductive path; and
Filling at least one of the apertures with the additional material which protects the electrically-conductive path by providing a sealing of the electrically-conductive path.

13. A method including the steps of claim 12 wherein the additional material includes a thermosetting epoxy material.

14. A method including the steps of claim 12 wherein the step of filling includes the step of choosing a fill material with a characteristic based on at least one characteristic of the substrate.

15. A method including the steps of claim 12 wherein the step of filling includes the step of choosing a fill material with a characteristic based on at least one characteristic of the electrically conductive path.

16. A method including the steps of claim 12 wherein the step of filling includes the step of choosing a fill material with a characteristic based on at least one characteristic of the substrate and one characteristic of the electrically conductive path.

17. A method including the steps of claim 12 wherein the step of filling includes the step of choosing a fill material with a characteristic based on at least coefficient of thermal expansion of the substrate.

18. A method including the steps of claim 12 wherein the step of choosing a fill material includes the step of choosing a material with a suitable amount of silica included therein to provide the desired coefficient of thermal expansion.

19. A method of making an electrical connector comprising the steps of:
Providing a non-conducting substrate material with apertures extending at least partially therethrough;
Mounting conductive elastic elements on at least one surface of the substrate;
Applying a first conductive material to at least some of the apertures and at least some of the conductive elastic elements to provide a conductive path from the conductive elements through the conductive material, said conductive material being within at least some of the apertures but not filling the apertures; and
Applying a second material within at least some of the apertures to fill at least part of the apertures and cover at least some of the conductive material, whereby at least some of the apertures including a first conductive material and a second material within the aperture.

20. An electrical connector comprising:
A substrate including an insulating body, at least one mounting surface and a plurality of apertures extending at least partially through the substrate;
A set of electrical contacts carried on the mounting surface of the substrate and at least some of the electrical contacts being adjacent to or on top of at least some of the apertures;
A first conductive material within at least some of the apertures and in contact with at least some of the electrical contacts providing an electrical path coupling the electrical contacts with a second surface of the substrate, said first conductive material only partially filling the apertures into which the first conductive material is within; and
A second material in the same aperture in which the first conductive material has been inserted, said second material covering at least part of the first conductive material and filling at least part of the aperture, said second material having a coefficient of thermal expansion which approximates the coefficient of thermal expansion of at least one of the substrate and the first conductive material.

21. An electrical connector of the type described in claim 20 wherein the substrate has a second mounting surface comprising mounting pads for at least one chosen from solderballs and surface mount attachments, where at least one of the mounting pads is electrically connected to at least one of the electrical contacts.

22. An electrical connector of the type described in claim 20 wherein the second material comprises a thermosetting epoxy.

23. An electrical connector of the type described in claim 20 wherein the second material has a coefficient of thermal expansion which has been chosen based on the coefficient of thermal expansion of the first material.

\* \* \* \* \*